United States Patent [19]

Konishi et al.

[11] Patent Number: 4,583,200
[45] Date of Patent: Apr. 15, 1986

[54] MAGNETIC MEMORY DEVICE CAPABLE OF MEMORIZING INFORMATION IN A STRIPE DOMAIN IN THE FORM OF A VERTICAL BLOCH LINE PAIR

[75] Inventors: Susumu Konishi, Fukuoka; Yasuharu Hidaka, Tokyo, both of Japan

[73] Assignee: NEC Corporation, Tokyo, Japan

[21] Appl. No.: 542,963

[22] Filed: Oct. 18, 1983

[30] Foreign Application Priority Data

Oct. 18, 1982 [JP] Japan ............................... 57-182346
Dec. 2, 1982 [JP] Japan ............................... 57-211747

[51] Int. Cl.$^4$ .............................................. G11C 19/08
[52] U.S. Cl. ......................................... 365/29; 365/15
[58] Field of Search ........................... 365/29, 15, 3, 12

[56] References Cited

U.S. PATENT DOCUMENTS 3,887,905 6/1975 Bobeck et al. ........................ 365/29

OTHER PUBLICATIONS

IEEE Transactions on Magnetics–vol. MAG-9, No. 4, Dec. 1973, pp. 617–621.

Primary Examiner—James W. Moffitt
Attorney, Agent, or Firm—Sughrue, Mion, Zinn, Macpeak and Seas

[57] ABSTRACT

In a magnetic memory device comprising a magnetic medium (21) having an easy axis of magnetization orthogonal to a principal surface of the medium, the medium has at least one stripe domain (20) surrounded by a domain wall which memorizes information in the form of a pair of vertical Bloch lines. Each pair is written in one end of the domain by supply of a local magnetic field to the one end when no magnetic bubble exists in the proximity of the one end. Each information is specified by absence or presence of each pair and successively transferred along the domain wall by a pulsed bias magnetic field. Readout operation is carried out at a preselected end of the stripe domain by supply of another local magnetic field to the preselected end to selectively chop the preselected end into a magnetic bubble only when each pair exists in the preselected end. Thus, presence and absence of each pair is converted into presence and absence of the bubble. Preferably, a negative Bloch line pair alone is memorized in the stripe domain. A pair of Bloch lines may previously be memorized prior to write-in operation of information.

8 Claims, 42 Drawing Figures

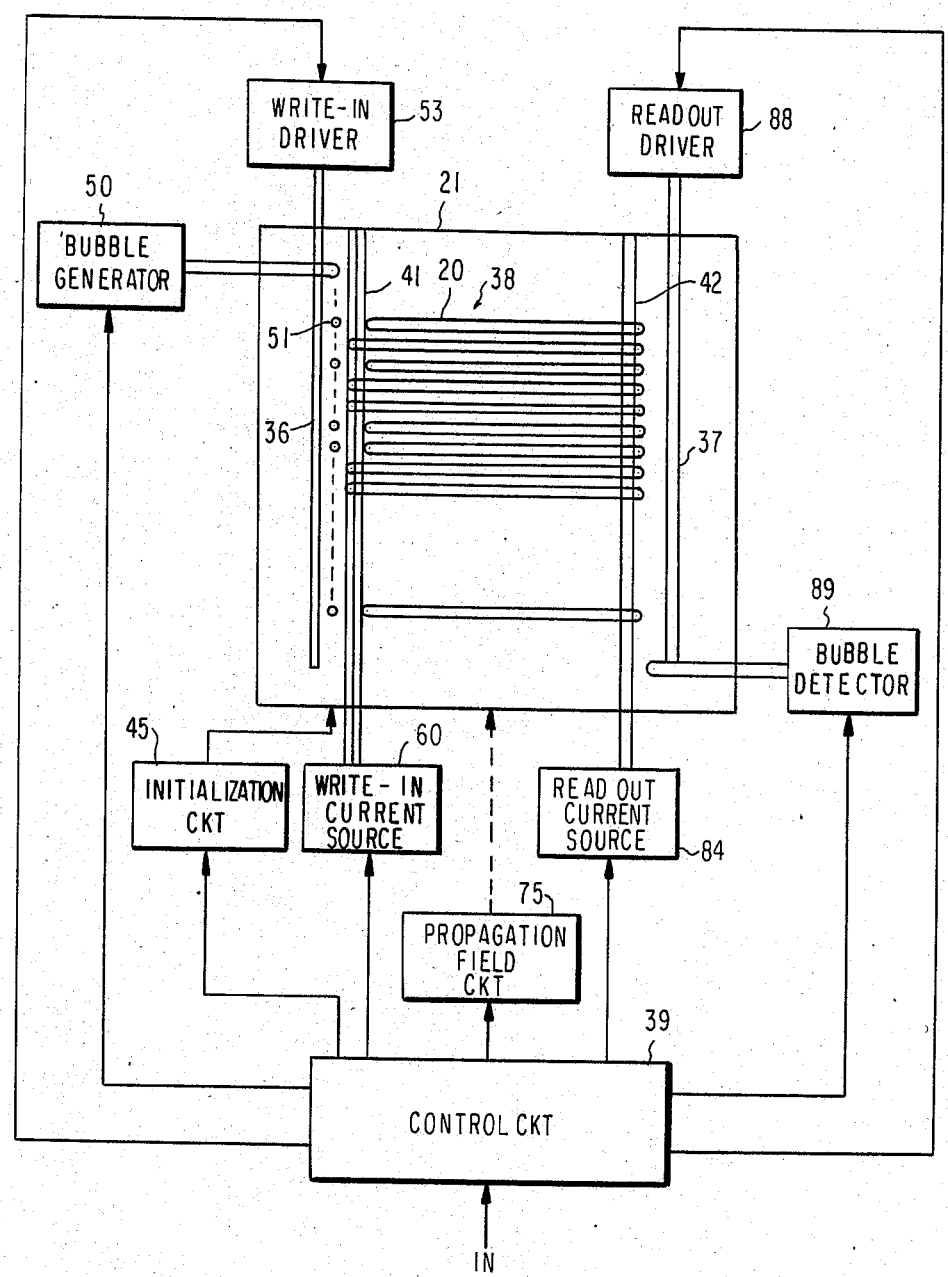

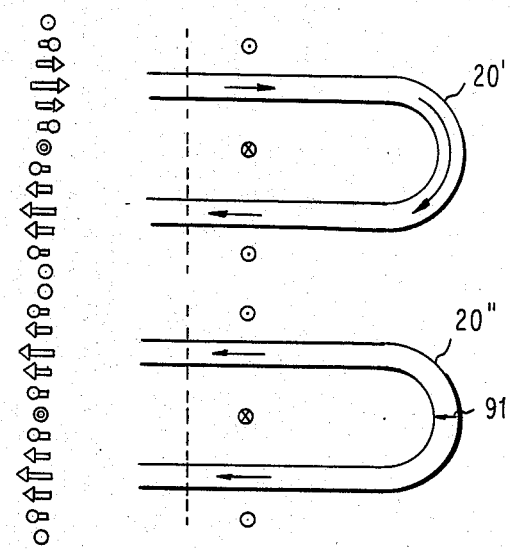
FIG. 8a
FIG. 8b
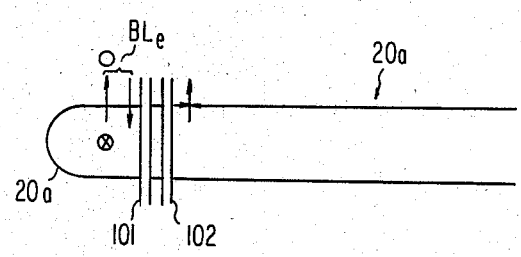
FIG. 9a
FIG. 9b
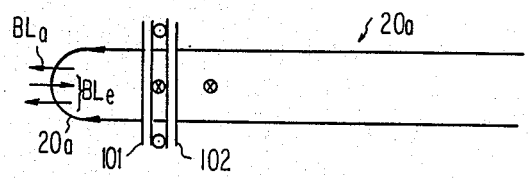
FIG. 9c
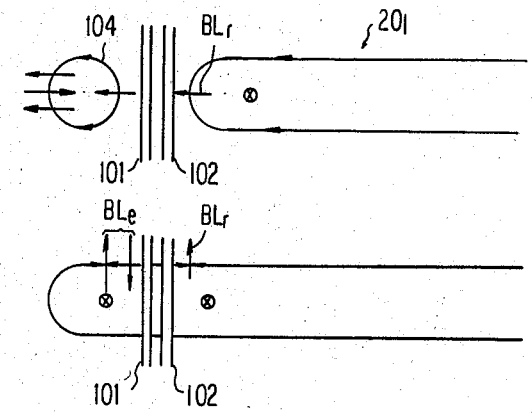
FIG. 9d

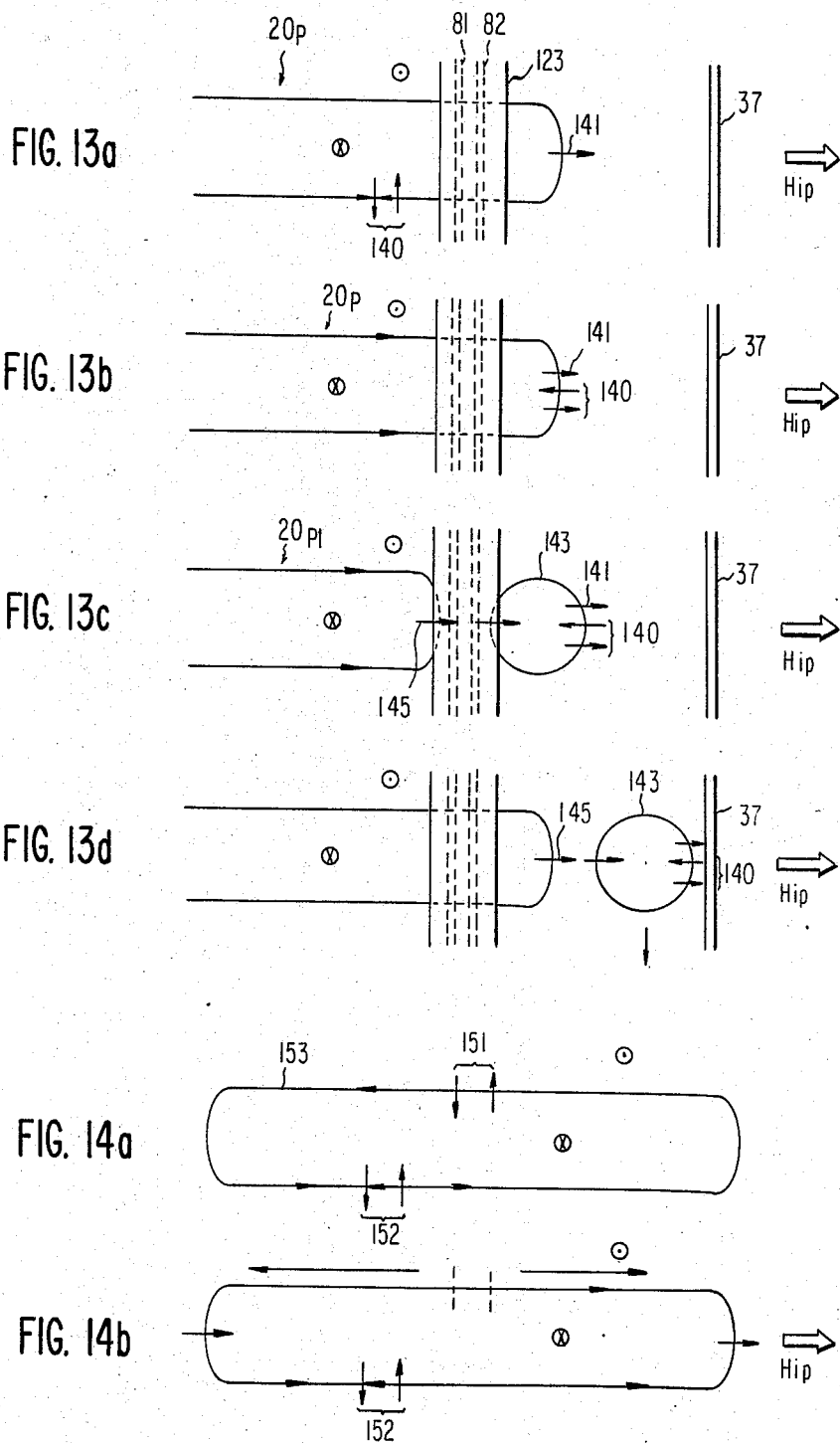

MAGNETIC MEMORY DEVICE CAPABLE OF MEMORIZING INFORMATION IN A STRIPE DOMAIN IN THE FORM OF A VERTICAL BLOCH LINE PAIR

BACKGROUND OF THE INVENTION

This invention relates to a magnetic memory device for memorizing information by the use of magnetic domains generated in a magnetic medium having an easy axis of magnetization orthogonal to a principal surface thereof.

In each conventional magnetic memory device of the type described, magnetic bubbles, namely, cylindrical domains are used as magnetic domains and transferred along predetermined propagation patterns by a magnetic field. Various attempts have been made to raise up a storage density of the magnetic memory device. For example, a device is proposed which has the propagation patterns formed by the use of an ion-implantation technique. This method is beneficial to memorize magnetic bubbles of a small size at a high density.

However, the storage density is dependent on a bubble size even when the propagation patterns are formed by the ion-implantation technique. It has been said that an attainable minimum bubble size is about 0.3 microns or micrometers so far as a garnet material is concerned. No discovery has ever been made of a practical material which is capable of generating magnetic bubbles less than 0.3 micron meter. Accordingly, it has been deduced that the minimum bubble size of 0.3 micron is an unsurmountable limit and that the upper limit of the storage density is determined by the above-mentioned minimum bubble size.

In AIP Conference Proceedings No. 24, pp. 617-629 (1974), O. Voegeli et al disclose a bubble lattice device wherein a great deal of magnetic bubbles are closely arranged in columns and rows. In this device, each magnetic bubble is surrounded by a domain wall having wall magnetization modified in accordance with information. In other words, information is memorized in each magnetic bubble by modifying the wall magnetization in response to the information, instead of using presence or absence of each magnetic bubble. The bubble lattice device has increased storage density as compared with the ion-implantation.

However, a certain distance should be left between two adjacent ones of the magnetic bubbles in consideration of interaction between the magnetic bubbles. Therefore, there is a limitation about improvement of the storage density.

SUMMARY OF THE INVENTION

It is an object of this invention to provide a magnetic memory device which is capable of considerably raising up storage density by the use of magnetic domains.

It is another object of this invention to provide a magnetic memory device of the type described, wherein information can be stably memorized.

A magnetic memory device to which this invention is applicable is capable of magnetically memorizing a plurality of information signals to produce an output signal representative of each of the information signals, by the use of a magnetic medium having a principal surface and an easy axis of magnetization orthogonal to the principal surface. According to this invention, the magnetic memory device comprises controllably generating means for controllably generating at least one magnetic domain of a stripe shape that is surrounded by a domain wall laid in substantial parallel to the easy axis and having wall magnetization along the domain wall and that has a pair of end portions opposite to each other and an intermediate portion between the end portions, write-in means adjacent to a predetermined one of the end portions and responsive to each information signal for writing the each information signal in the domain wall in the form of a first pair of vertical Bloch lines intersecting the domain wall, detecting means adjacent to a specific one of the end portions for detecting the vertical Bloch lines to produce the output signal, and transferring means for transferring said vertical Bloch line pair from the predetermined end portion to the specific one of the end portions through the intermediate portion along the domain wall.

BRIEF DESCRIPTION OF THE DRAWING

FIG. 2 shows a block diagram for use in describing a magnetic memory device according to a first and a second embodiment of this invention in common;

FIGS. 8(a) and 8(b) show diagrammatical views for use in describing a twist of wall magnetization;

FIGS. 9(a)–9(d) show plan views for use in describing erasing operation of the magnetic memory device according to the first embodiment;

FIGS. 13(a)–13(d) show plan views for use in describing erasing operation of the magnetic memory device according to the second embodiment;

FIGS. 14(a) and 14(b) show plan views for use in describing interaction between Bloch lines and an in-plane magnetic field.

DESCRIPTION OF THE PREFERRED EMBODIMENTS

Figure 1:
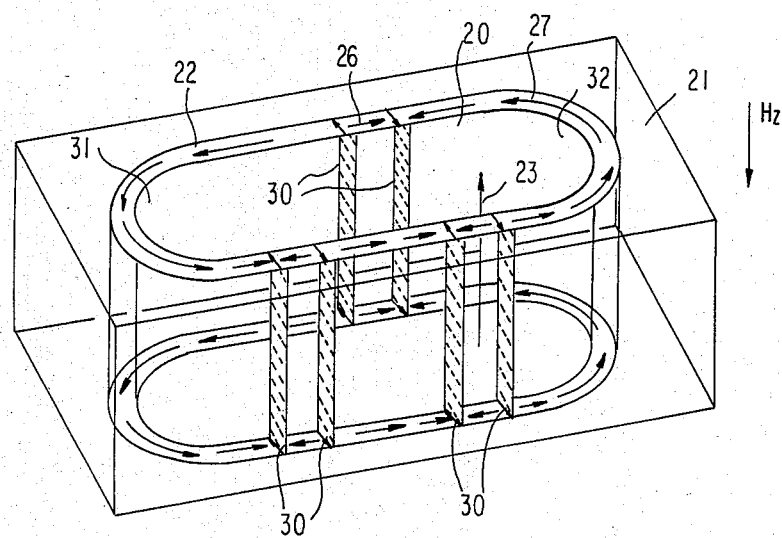
FIG. 1 shows a diagrammatical view for describing a stripe domain and vertical Bloch lines for use in this invention.

Referring to FIG. 1, description will be made about a principle of this invention for a better understanding of this invention. In FIG. 1, a stripe-shaped magnetic domain 20 will simply be called a stripe domain hereinafter. The stripe domain 20 is formed in a magnetic medium 21, such as a garnet layer, having a principal surface directed towards top of this figure and an easy axis of magnetization orthogonal to the principal surface. Thus, the magnetic medium 21 exhibits uniaxial anisotropy. The stripe domain 20 is surrounded by a domain wall 22. The domain wall 22 has a certain thickness and depicted merely for convenience of illustration by solid lines. If a bias magnetic field Hz is provided downwards of FIG. 1, magnetization is directed within the stripe domain 20 upwards as shown by an arrow 23 while magnetization is directed downwards outside of the stripe domain 20.

The domain wall 22 has wall magnetization therealong. The illustrated wall magnetization includes clockwise magnetization 26 and counterclockwise magnetization 27. Vertical Bloch lines 30 appear at each portion at which the clockwise magnetization 26 butts the counterclockwise magnetization 27 and are perpendicular to the principal surface of the magnetic medium 21. As known in the art, the vertical Bloch lines 30 always exist in pairs in the domain wall and have either positive or negative signs. In addition, the stripe domain 20 has a property dependent on the number of revolutions of the wall magnetization, as will later become clear.

The stripe domain 20 has a pair of end portions 31 and 32 which may often be called first and second stripe heads, respectively, and an intermediate portion between the stripe heads 31 and 32. The stripe domain 20 is expandable and retractable in a direction passing through both end portions 31 and 32 when controlled by a magnetic field in a manner to be described later.

It is found out that the end portions 31 and 32 can readily be chopped off the stripe domain 20 when the vertical Bloch line pair 30 are present in the domain wall 22 and that the vertical Bloch line pair 30 can be moved along the domain wall 22. In addition, the vertical Bloch line pair 30 is found to be intentionally written in the domain wall 22 and to be selectively removed from the domain wall 22 in a manner to be described later. Under the circumstances, the inventors have discovered that the vertical Bloch line pair 30 serves to memorize a unit of information, namely, a single bit. A storage density can remarkably be increased as compared with a conventional magnetic memory device of the magnetic bubble type because the vertical Bloch line pair is considerably smaller than each magnetic bubble.

Referring to FIG. 2, a magnetic memory device according to a first embodiment of this invention comprises a magnetic medium or film 21 having a principal surface directed upwards of FIG. 2 and an easy axis of magnetization orthogonal to the principal surface, like in FIG. 1. The magnetic memory device comprises, on the magnetic medium 21, first and second major lines 36 and 37 placed at first and second predetermined positions, respectively, and a minor loop portion 38 laid between the first and the second predetermined positions. The minor loop portion 38 is for storing each of information signals. The first major line 36 is operable to write each of the information signals in the minor loop portion 38 while the second major line 37 is operable to read each information signal out of the minor loop portion 38. Each of the first and the second major lines 36 and 37 is driven by a dual conductor pattern driving method, instead of a rotating inplane field driving method which is frequently used. This is because use of the latter method results in a probability that each information is objectionably extinct in the minor loop portion 38 due to interaction between a rotating inplane field and the vertical Bloch line pair. Thus, the magnetic memory device may be called a device of a major line minor loop type. The magnetic memory device is put into operation under control of a control circuit 39, as will become clear as the description proceeds.

Figure 3:
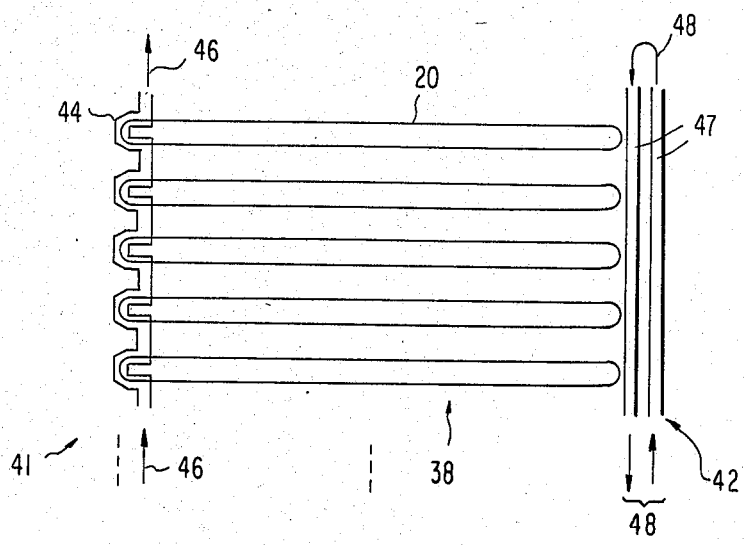
FIG. 3 shows a plan view for use in describing initial operation of the magnetic memory device according to the first embodiment.

Referring to FIG. 2 again and FIG. 3 afresh, a first conductor portion 41 is laid along the first major line 36 with a first spacing left between the first conductor portion 41 and the first major line 36. A second conductor portion 42 is laid along the second major line 37 with a second spacing left between the second conductor portion 42 and the second major line 37. As illustrated in FIG. 3, the first conductor portion 41 comprises a hairpin-shaped conductor 44 coated on the principal surface of the magnetic medium and connected to an initialization circuit 45 (FIG. 2) operable under control of the control circuit 39.

The hairpin-shaped conductor 44 cooperates with the initialization circuit 45 to form a plurality of stripe domains 20 in substantial parallel in the minor loop portion 38. More specifically, a strong magnetic field orthogonal to the principal surface is at first applied onto the magnetic medium 21 to clear all domains from the magnetic medium 21. An electric current 46 is caused to flow through the hairpin-shaped conductor 44 to produce a local magnetic field which has intensity enough to make bubble domains generate in the magnetic medium 21. Thus, a plurality of bubble domains appear in a line along the hairpin-shaped conductor 44. Thereafter, an inplane magnetic field is given in a direction perpendicular to the hairpin-shaped conductor 44 by the use of conventional means (not shown), with the orthogonal magnetic field gradually reduced. As a result, the bubble domains are changed into the stripe domains 20.

The stripe domains 20 may objectionably exceed the hairpin-shaped conductor 44 on the lefthand side of FIG. 3. In this event, it is possible to remove each excessive portion by causing an electric current to flow through the hairpin-shaped conductor 44 in a direction inverse to that of the electric current 46. Thus, the lefthand end portions, namely, the first stripe heads of the stripe domains 20 are aligned with one another.

On the other hand, the righthand end portions of the stripe domains may irregularly be arranged on the magnetic medium 21. In order to trim the righthand end portion of each stripe domain 20, the second conductor portion 42 comprises a pair of conductors 47 through which an electric current is caused to flow, as indicated by an arrow 48.

In the interim, consideration may be directed to that conventional method of producing a plurality of stripe domains in parallel, which is proposed by O. Voegeli et al in a paper for AIP Conference Proceeding No. 24, pp. 617–621 (1974). In this method, a weak magnetic field of a high frequency is applied normal to a plane of a device with a strong magnetic field of a low frequency applied in the plane. It is, however, difficult with this method to precisely control the number and positions of the stripe domains. Therefore, application of the above-mentioned method to this invention is not convenient.

Referring to FIGS. 4(a)–4(e) together with FIG. 2, description will be made about write-in operation. In FIG. 2, the magnetic memory device comprises a bubble generator 50 for generating a succession of magnetic bubbles 51 to send the same along the first major line 36. Presence and absence of the magnetic bubbles 51 are controlled by the control circuit 39 in response to each of the information signals (depicted at IN in FIG. 2) to be written in each stripe domain 20. Let the bubble generator 50 produce each magnetic bubble under control of the control circuit 39 when each information signal IN takes a logic "1" level and, otherwise, produce no magnetic bubble. Such a bubble generator 50 may be a conventional one. Each magnetic bubble 51 is driven by a write-in driver 53 along the first major line 36 to a predetermined position under control of the control circuit 39.

When each magnetic bubble 51 is in the proximity of the first stripe head, each of the stripe domains 20 is retracted rightwards of FIG. 2 by magnetic repulsive force. Therefore, the first stripe head of each stripe domain 20 is spaced apart from the first conductor portion 41 by the influence of each magnetic bubble 51. On the other hand, the first stripe head of each stripe domain 20 is in the vicinity of the first conductor portion 41 in the absence of each magnetic bubble 51.

Under the circumstances, the vertical Bloch line pair are written only in the stripe domains 20 the first stripe heads of which are in the vicinity of the first conductor portion 41. In other words, the write-in operation of the vertical Bloch line pair is possible only when the magnetic bubbles 51 are not placed in the vicinity of the stripe heads of the stripe domains 20. This means that presence and absence of the vertical Bloch line pair in each stripe domain 20 can be made to correspond to binary logic levels, for example, the logic "0" and the logic "1" levels, respectively.

In FIGS. 4(a)-4(e), the first conductor portion 41 comprises first, second, and third write-in lines 56, 57, and 58 which are arranged in parallel and which may be formed in a known manner on the hairpin-shaped conductor 44 (FIG. 3) with an insulator interposed between the hairpin-shaped conductor 44 and the first through the third write-in lines 56 to 58. The first write-in line 56 is parallel to the first major line 36 with the first spacing left therebetween. The first through the third write-in lines 56 to 58 serve to carry out the write-in operation in cooperation with a write-in current source 60 controlled by the control circuit 39, in a manner to presently be described. The magnetic bubbles 51 (not shown in this figure) are transferred along the first major line 36.

Figure 4A:
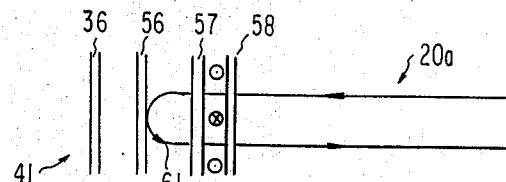
FIGS. 4(a)–4(e) show plan views for use in describing write-in operation of the magnetic memory device according to the first embodiment.

It is assumed in FIGS. 4(a)-4(e) that an information signal of the logic "0" level is written in a specific one of the stripe domains that is depicted at 20a in FIGS. 4(a)-4(e). In this event, no magnetic bubble is given in the vicinity of the specific stripe domain 20a along the first major line 36. Under the circumstances, the first stripe head (indicated at 61) of the specific stripe domain 20a is extended to the first write-in line 56, as shown in FIG. 4(a). The specific stripe domain 20a has a domain wall (symbolized by a single line) having wall magnetization directed counterclockwise as depicted by lines with arrowheads. Magnetization is directed within the specific stripe domain 20a downwards of FIG. 4(a), as shown at an encircled crisscross while magnetization is directed upwards of FIG. 4(a) outside of the specific stripe domain 20a, as shown by an encircled dot.

On the write-in operation, the write-in current source 60 causes a first current pulse $I_{P1}$ to flow through the first write-in line 56 under control of the control circuit 39 (FIG. 2). Supply of the first current pulse $I_{P1}$ gives rise to slight rightward movement of the specific stripe domain 20a and to a local twist of the wall magnetization. As a result, wall magnetization is locally rotated by 180° relative to the remaining wall magnetization to produce local clockwise magnetization at the first stripe head 61, as shown at an arrow 63 in FIG. 4(b). Such operation may be referred to dynamic conversion. Thus, the local clockwise magnetization collides with the wall magnetization at two portions at which a pair of vertical Bloch lines 66 and 67 appear. As mentioned before, the vertical Bloch lines 66 and 67 are written in pair in the specific stripe domain 20a and can be specified by positive and negative signs, respectively. The vertical Bloch lines 66 and 67 will therefore be called positive and negative Bloch lines, respectively.

It is to be noted here that recombination is liable to occur in a pair of vertical Bloch lines when a positive one of the vertical Bloch lines is adjacent to a negative one thereof. Accordingly, such a pair of vertical Bloch lines are unstable. It is possible to avoid the recombination of the vertical Bloch line pair by providing an inplane magnetic field which is depicted at $H_{ip}$ in FIG. 4(b) and which is parallel to the first through the third write-in lines 56 to 58. This is because the parallel inplane field is helpful to stabilize the wall magnetization.

However, it is not practicable to hold such a parallel inplane field at all times. Taking the above into consideration, selection is made so as to arrange in the specific stripe domain 20a a pair of vertical Bloch lines both of which are specified by the same sign. Such an arrangement serves to stably keep the vertical Bloch line pair in the specific stripe domain 20a without supply of the parallel inplane field $H_{ip}$. In the example being illustrated, a pair of negative Bloch lines are selected by reasons which will later be described.

Figure 4B:
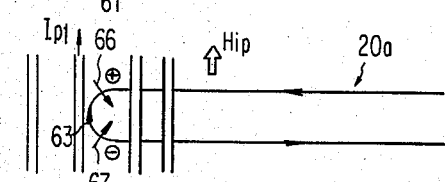
Figure 4C:
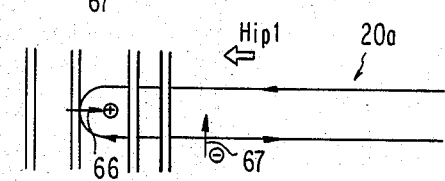

In FIG. 4(c), an inplane magnetic field $H_{ip1}$ is produced in the magnetic medium 21 in the well-known manner, parallel to the principal plane and substantially orthogonal to the first through the third write-in lines 56 to 58. As a result, the positive Bloch line 66 is moved to an apex of the first stripe head while the negative Bloch line 67 is shifted rightwards of this figure to be put on the righthand side of the third write-in line 58. This is because Zeeman energy can be reduced when the wall magnetization is directed towards the orthogonal inplane field $H_{ip1}$.

Figure 4D:
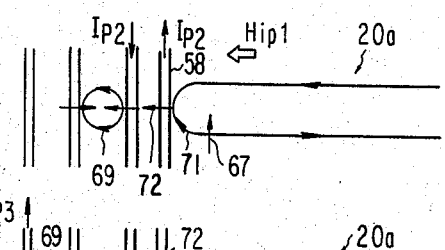

In this state, the second and the third write-in lines 57 and 58 are supplied from the write-in current source 60 (FIG. 2) with second current pulses $I_{P2}$ which flow opposite to each other, as illustrated in FIG. 4(d). According to the inventors' experimental studies, each stripe domain can readily be chopped off by supply of current pulses when vertical Bloch lines exist in the domain wall. Practically, each stripe domain is chopped by each current pulse between 26 and 32 mA when a gap between the second and the third lines 57 and 58 is equal to 4 microns.

In any event, the first stripe head 61 of the specific stripe domain 20a is chopped into a useless or insignificant magnetic bubble 69 while the remaining stripe domain 20 is rendered into a short stripe domain having a new stripe head 71, as illustrated in FIG. 4(d). As a result, a negative Bloch line 72 remains in the new stripe head 71 by the influence of the inplane magnetic field $H_{ip}$ while positive Bloch lines are left in pair in the useless magnetic bubble 69.

Thus, the negative Bloch lines 67 and 72 are kept in the short stripe domain in pair. Such a pair of vertical Bloch lines are stably kept in the short stripe domain even when both of the vertical Bloch lines 67 and 72 are near to each other.

In the above-mentioned write-in operation, absence of each magnetic bubble 51 sent along the first major line 36 is transferred to the specific stripe domain 20a in the form of the negative Bloch line pair 67 and 72. Thus, the information signal of the logic "0" level is memorized in the specific stripe domain 20a.

The useless magnetic bubble 69 is moved along the first major line 36 by supplying the first major line 36 with third current pulses $I_{P3}$ and is finally erased.

The write-in operation of the logic "1" level will briefly be described below. In this event, one of the magnetic bubbles 51 is disposed along the first major line 36 in the proximity of the specific stripe domain 20a. Let the stripe end 61 (FIG. 4(a)) of the specific stripe domain 20a be retracted rightwards to a position of the new stripe head 71 (FIG. 4(d)) by the repulsive force between the one magnetic bubble and the specific stripe domain 20a. Under the circumstances, no vertical Bloch line is written in the specific stripe domain 20a even when the first current pulse $I_{P1}$ is supplied to the first write-in line 56, as shown in FIG. 4(b). This is because the specific stripe domain 20a retracted by the one magnetic bubble is far from the first write-in line 56. As a result, an information signal of the logic "1" level is memorized in the specific stripe domain 20a as absence of a vertical Bloch line pair.

Referring to FIG. 2 again together with FIGS. 4(a)-4(e), the vertical Bloch line pair 67 and 72 written in the above-mentioned manner should successively be moved or transferred from the first stripe head towards the second one, so as to write a sequence of information signals in the specific stripe domain 20a in the form of vertical Bloch line pairs. To this end, the magnetic memory device comprises a propagation field circuit 75 controlled by the control circuit 39 for successively propagating each pair of the vertical Bloch lines from one of the stripe heads to the other thereof. Such propagation may cyclically be carried out along the domain wall of each stripe domain 20. More specifically, the propagation field circuit 75 produces a pulsed magnetic field which is orthogonal to principal surface and which is common to the respective stripe domains 20. The propagation field circuit 75 may be a coil adjacent to the magnetic medium 21.

In the above-mentioned manner, a great deal of the vertical Bloch line pairs can be memorized in each stripe domain 20. This is because a distance between two lines of each vertical Bloch line pair can be kept very narrow, as will presently become clear.

Figure 5:
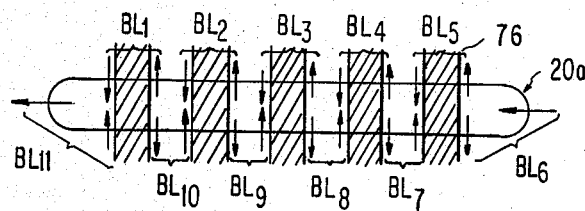
FIG. 5 shows a plan view for use in describing transfer operation of the magnetic memory device according to the first embodiment.

Referring to FIG. 5, eleven bits of the information signals are memorized in the specific stripe domain 20a as first through eleventh pairs $BL_1$ to $BL_{11}$ of the vertical Bloch lines. A distance D between two lines of each pair is kept in a state of equilibrium in relation to interaction between two lines of each pair. Such interaction is classified into first and second interactions which result from magnetostatic energy and exchange interaction, respectively. The magnetostatic energy also results from magnetic poles induced at positions of the respective vertical Bloch line in a manner to be described soon. The exchange interaction results from a twist of the wall magnetization. The magnetostatic energy causes attraction to occur between two lines of each pair so as to narrow the distance D therebetween while the exchange interaction causes repulsion to occur so as to widen the distance. Equilibrium between the magnetostatic energy and the exchange interaction puts the distance D between two lines of each pair into an equilibrium distance $D_0$. When the magnetic medium 21 has a very large quality factor Q, the equilibrium distance $D_0$ is given by:

$$D_0 = \pi \Lambda, \qquad (1)$$

where $\Lambda$ is equal to $(A/2\pi M_s^2)$ where, in turn, A represents an exchange interaction constant and $M_s$, saturation magnetization of the magnetic medium 21. The equilibrium distance $D_0$ is substantially equal to a characteristic length L inherent to the magnetic medium 21. This means that each pair may be spaced apart from the adjacent pair with the characteristic length left therebetween. Inasmuch as each pair corresponds to a single bit of the information signal, a bit interval between two adjacent bits may be equal to twice the characteristic length L in each stripe domain 20.

More specifically, it will be assumed that the magnetic medium 21 has an area of 1 cm² and the characteristic length of 0.125 micron and that the number of the stripe domains 20 are equal to 5,000. Inasmuch as the bit interval becomes equal to 0.25 micron, each domain wall of 1 cm long can hold the vertical Bloch line pairs of $4 \times 10^4$. Since the number of the domain walls is equal to 10,000, a bit capacity of the above-mentioned magnetic medium 21 becomes equal to 400 megabits.

When the vertical Bloch line pairs are successively and continuously stored in each stripe domain 20 in response to a sequence of the logic "0" levels, a distance between two adjacent pairs is stably kept equal to the equilibrium distance $D_0$. It is preferable that the equilibrium distance $D_0$ is kept intact even when the vertical Bloch line pairs are discretely stored in each stripe domain 20 in response to an information series, such as "001010001," having discontinuous sequences of the logic "0" level.

In FIG. 5, a plurality of patterns 76 are formed in parallel transversely of the respective stripe domains 20 on the magnetic medium 21. Each pattern is of Permalloy and has a width equal to the equilibrium distance $D_0$. A spacing between two adjacent patterns is substantially equal to the width. Such patterns serve to keep the distance D constant between two adjacent bits and transfer each pair of the vertical Bloch lines one by one, namely, bit by bit in each stripe domain 20 in cooperation with the pulsed magnetic field supplied from the propagation field circuit 75. Briefly, supply of the pulsed magnetic field gives rise to the magnetic poles on both sides of each pattern 76. The magnetic poles interact with each of the vertical Bloch line pairs to vary the attraction and the repulsion in the respective vertical Bloch line pairs. As a result, each pair is shifted along the domain wall with the equilibrium distance $D_0$ kept constant.

In order to carry out the above-mentioned transfer or shift operation, the pulsed magnetic field is selected in an amplitude H and a pulse width T so as to move each pair by the bit interval equal to twice the equilibrium distance $D_0$. As readily understood from Equation (1), the bit interval is represented by $2\pi\Lambda$. A relationship between the amplitude H and the pulse width T should be determined to move each pair by $2\pi\Lambda$ and is given by:

$$HT = 2\pi\Lambda \cdot (2/\pi) \cdot Q^{-\frac{1}{2}} \cdot \gamma^{-1} \cdot (Ku/A)^{\frac{1}{2}} = 250 \text{ (Oe·nanoseconds)}, \quad (2)$$

where $\gamma$ represents a gyromagnetic ratio; Ku, a uniaxial anisotropy constant; and A, an exchange interaction constant. Equation (2) shows that each pair can be shifted by $2\pi\Lambda$ if the pulsed magnetic field has the amplitude of 25 Oe and the pulse width of 10 nanoseconds.

Let consideration be directed to a velocity v of each pair. The velocity v becomes slow with an increase of the number of the vertical Bloch line pairs memorized in each stripe domain 20. For example, when each stripe domain 20 is closely filled with the vertical Bloch line pairs, the velocity v is reduced to about one thousandth as compared with a stripe domain having no vertical Bloch line pair. However, successive transfer of each pair is not adversely affected by variation of the velocity v.

Referring to FIGS. 6(a)–6(d) together with FIG. 2, the second conductor portion 42 comprises first and second readout lines 81 and 82 extended in parallel with a gap left therebetween. The first and the second readout lines 81 and 82 are transverse to each of the stripe domains 20 at the second stripe heads thereof and may be identical with the conductor pair 47 illustrated in FIG. 3. The first and the second readout lines 81 and 82 are connected to a readout current source 84 controlled by the control circuit 39. In FIGS. 6(a)–6(d), the specific stripe domain 20a is typical of the stripe domains 20. In addition, the second major line 37 is illustrated together with the readout lines 81 and 82 in FIGS. 6(a)–6(d). Herein, let the vertical Bloch line pair 67 and 72 written in the specific stripe domain 20a be read out of the specific stripe domain 20a after they are transferred from the first stripe head of the specific stripe domain 20a to the second stripe head thereof in the manner described in conjunction with FIG. 5.

Figure 6A:
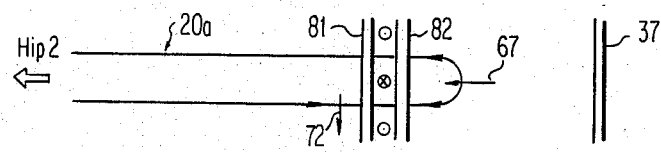
FIGS. 6(a)–6(d) show plan views for use in describing readout operation of the magnetic memory device according to the first embodiment.
Figure 6B:
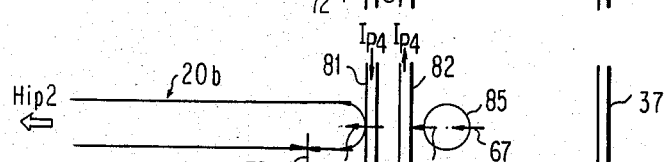

In FIG. 6(a), an inplane magnetic field $H_{ip2}$ is applied normal to the first and the second readout lines 81 and 82. As a result, the one (67) of the vertical Bloch lines is stably kept at the second stripe head with the other (72) disposed on the lefthand side of the first readout line 81.

In this state, the first and the second readout lines 81 and 82 are supplied with fourth current pulses $I_{P4}$ opposite to each other, as illustrated in FIG. 4(b). The specific stripe domain 20a is readily chopped by supply of the fourth current pulses $I_{P4}$ into a significant magnetic bubble 85 and the remaining stripe domain 20b which may be called a shortened stripe domain.

It should be noted here that the one vertical Bloch line 67 between the counterclockwise wall magnetization and the local clockwise magnetization is different from the other vertical Bloch line 72, as suggested by arrows in FIG. 6(a). More specifically, wall magnetization is so to speak diverged from the one vertical Bloch line 67, and converged at the other vertical Bloch line 72. When the one vertical Bloch line 67 is chopped off the specific stripe domain 20a, the same vertical Bloch line 67a as the one vertical Bloch line 67 is reproduced or replicated in the shortened stripe domain 20b and is therefore a negative vertical Bloch line. Such replication is observed in connection with a negative vertical Bloch line alone. This is the reason why the negative Bloch line pair is utilized in the illustrated magnetic memory device.

On the other hand, a negative vertical Bloch line 86 is left in the significant magnetic bubble 85 along with the negative vertical Bloch line 67 chopped from the specific stripe domain 20a.

Figure 6C:
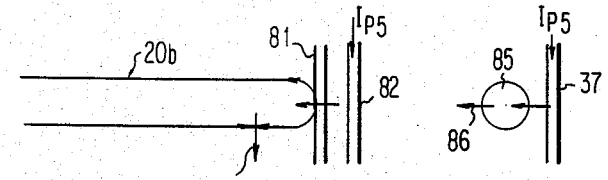

Subsequently, the significant magnetic bubble 85 is moved towards the second major line 37 by supplying currents $I_{P5}$ to both of the second readout line 82 and the second major line 37, as illustrated in FIG. 6(c). Thereafter, the significant magnetic bubble 85 is transferred along the second major line 37 by the use of a readout driver 88 (FIG. 2) to a bubble detector 89 (FIG. 2). The readout driver 88 and the bubble detector 89 both of which are controlled by the control circuit 39 may be known in the art and are therefore described no longer.

Figure 6D:
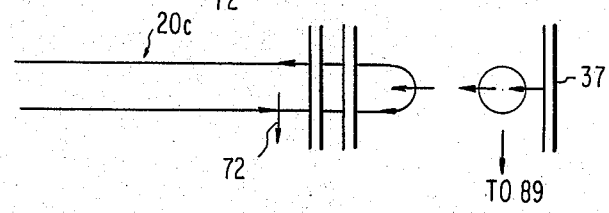
Figure 7A:
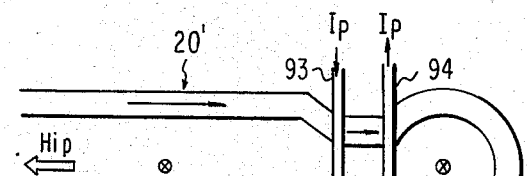
FIGS. 7(a) and 7(b) show diagrammatical views for use in describing a relationship between wall magnetization and chopping operation of a stripe domain.
Figure 7B:
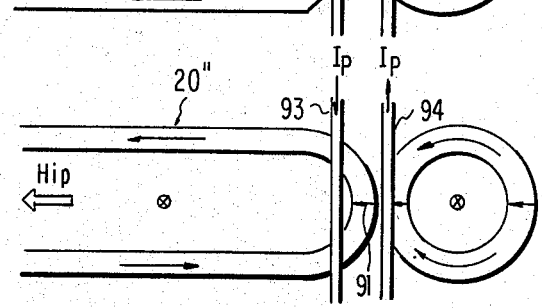

It is possible to expand the shortened stripe domain 20b into an expanded stripe domain 20c similar in size to the specific stripe domain 20a, as shown in FIG. 6(d).

When no negative Bloch line pair is present at the second stripe head, no significant magnetic bubble is chopped off, as will become clear. Therefore, presence and absence of each vertical Bloch line can be converted into presence and absence of the significant magnetic bubble 85, respectively.

Referring to FIGS. 7(a), 7(b) and 8(a), 8(b), properties of each stripe domain 20 will be described which are utilized in FIGS. 4 and 6 to locally chop the specific stripe domain 20a into a single magnetic bubble and the remaining stripe domain. A stripe domain depicted at 20' in FIG. 7(a) has no vertical Bloch line while a stripe domain depicted at 20" in FIG. 7(b) has vertical Bloch lines one of which is illustrated at 91 in FIG. 7(b). For simplicity of description, the stripe domains 20' and 20" illustrated in FIGS. 7(a) and 7(b) will be referred to as first and second stripe domains, respectively.

The property of the first stripe domain 20' is different from that of the second stripe domain 20". More specifically, the second stripe domain 20" is readily chopped off in comparison with the first stripe domain 20' when current pulses $I_P$ are caused to flow through parallel conductors 93 and 94 in opposite senses, as mentioned before.

The reasons will be described below with reference to FIGS. 8(a) and 8(b). The first stripe domain 20' illustrated in FIG. 8(a) has no vertical Bloch line, as described in conjunction with FIG. 7(a). Let the first stripe domain 20' be cut in the vicinity of a stripe head along a broken line normal to upper and lower domain walls. A sense of wall magnetization in the upper domain wall is inverted relative to that of wall magnetization in the lower domain wall, as shown on the lefthand side of FIG. 7(a). In other words, the wall magnetization in the lower domain wall is twisted or rotated through 180° relative to that in the upper domain wall. In this event, an increase of exchange energy between the magnetization inside and outside the domain wall is evaded by avoiding a reduction of a width of the first stripe domain 20'. Stated otherwise, the magnetization inside the first stripe domain 20' is protected from being rotated in the same direction as the magnetization outside the first stripe domain 20'. As a result, the first stripe domain 20' is not chopped off even when the pulse currents $I_P$ are caused to flow through the conductors 93 and 94 as long as they are smaller than a predetermined current level to be described later.

On the other hand, the second stripe domain 20" has the negative vertical Bloch line at the stripe head thereof, as shown in FIG. 8(b). Let the second stripe domain 20" be cut like in FIG. 8(a). It is to be noted here that a sense of wall magnetization in an upper domain wall is the same as that of wall magnetization in a lower domain wall, as illustrated on the left-hand side of FIG. 8(b). In addition, magnetization inside the domain wall is twisted or rotated by a half revolution relative to that outside the domain wall.

In this event, the exchange interaction increases between the magnetization inside and outside the domain wall in the vicinity of the conductors 93 and 94 with a reduction of a width therebetween, when the current pulses $I_P$ flow through the conductors 93 and 94. As a result, the magnetiztion inside the domain wall is forcibly rotated in the same direction as the magnetization outside the domain wall. Accordingly, the second stripe domain 20" can readily be chopped off.

Referring to FIGS. 9(a)-9(d), description will be made about a method of erasing a particular one ($BL_e$) of the vertical Bloch line pairs from the specific stripe domain 20a. For this purpose, a pair of conductive lines depicted at 101 and 102 are laid on the magnetic medium 21 in a known manner and may be the second and the third write-in lines 57 and 58 illustrated in FIGS. 4(a)-4(e). The particular Bloch line pair $BL_e$ to be arased is at first disposed on the lefthand side of the conductive line 101, as illustrated in FIG. 9(a).

Subsequently, an inplane field $H_{ipe}$ is applied transversely of the conductive lines 101 and 102, as shown in FIG. 9(b). As a result, the particular Bloch line pair $BL_e$ is moved to the first stripe head. It should be noted here that the particular Bloch line pair $BL_e$ is accompanied by one line $BL_a$ of the next following vertical Bloch line pair, as illustrated in FIG. 9(b).

Under the circumstances, current pulses are caused to flow through the conductive lines 101 and 102, like in FIG. 4. The specific stripe domain 20a is chopped off by the current pulses to be divided into a magnetic bubble 104 and the remaining stripe domain $20_1$. As a result, a single vertical Bloch line $BL_r$ is replicated at a stripe head of the remaining stripe domain $20_1$, as shown in FIG. 9(c), and is the same as the next following Bloch line $BL_a$. When the remaining stripe domain $20_1$ is returned to a normal stripe domain $20_2$ as illustrated in FIG. 9(d), the particular Bloch line pair $BL_e$ is removed from the normal stripe domain $20_2$ with the replicated Bloch line $BL_r$ kept in the normal stripe domain $20_2$, as depicted at a broken line pair and a single solid line in FIGS. 9(a)-9(d).

In order to clear all of the stripe domains from the magnetic medium 21, a high bias magnetic field may be applied perpendicular to the magnetic medium 21. Thereafter, each magnetic bubble is generated to be changed to a stripe domain having no vertical Bloch line pair in the aforementioned manner. The number of revolutions of wall magnetization which is represented by S is equal to unity in such a stripe domain, as known in the art.

Figure 10A:
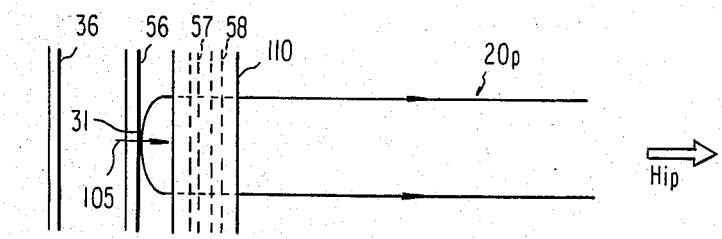
FIGS. 10(a)–10(e) show plan views for use in describing write-in operation of a magnetic memory device according to the second embodiment of this invention.

Referring to FIGS. 10(a)-10(e) together with FIG. 2, a magnetic memory device according to a second embodiment of this invention memorizes each of information signals by the use of stripe domains different from those illustrated in conjunction with FIG. 4(a) in an initial state in which no information signal is kept in the stripe domains. In FIG. 10(a), a particular stripe domain depicted at $20_P$ is typical of the stripe domains and previously has a pair of negative Bloch lines at both of first and second stripe heads thereof, although only one of the negative vertical Bloch lines is shown by 105 in FIGS. 10(a)-10(e). Such a Bloch line pair may be called a nominal Bloch line pair. As known in the art, when a domain, such as the particular stripe domain $20_P$, has a pair of negative Bloch lines, the number S of revolutions of wall magnetization is equal to zero when the wall magnetization proceeds around a domain wall. On the other hand, the number S of the specific stripe domain 20a illustrated in FIG. 4(a) is equal to unity, as mentioned before. In general, such a domain of $S=0$ in FIG. 10(a) can stably keep each Bloch line pair in comparison with a domain 20a of $S=1$, as will be described later. To begin with, mention will be made about write-in operation with reference to FIGS. 10(a)-10(e). The write-in operation is carried out by the use of the first major line 36 and the first through the third write-in lines 56 to 58, as is the case with FIGS. 4(a)-4(e). The first major line 36 and the first through the third write-in lines 56 to 58 are formed on the magnetic medium 21 in the known manner. In addition, the second and the third write-in lines 57 and 58 are covered with a stripe conductor 110 with an insulator interposed therebetween.

An inplane magnetic field $H_{ip}$ is applied parallel to each of upper and lower portions of the domain wall during the write-in operation in order to stably transfer each Bloch line pair along the domain wall. When no magnetic bubble is present along the first major line 36 in the vicinity of the first stripe head of the particular stripe domain $20_P$, the first stripe head 31 is adjacent to the first write-in line 56 on the righthand thereof. The nominal Bloch lines are stably kept at the first and the second stripe heads by supply of the inplane magnetic field $H_{ip}$, as exemplified by 105 in FIG. 10(a).

Figure 10B:
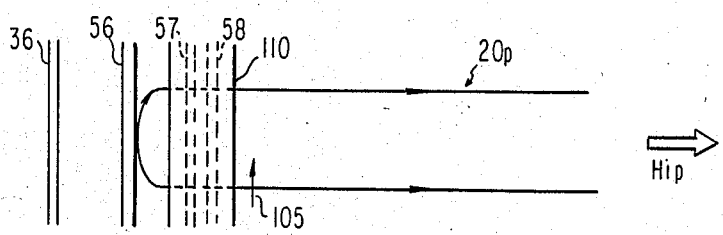

In FIG. 10(b), the one negative Bloch line 105 is shifted counterclockwise along the domain wall to be put on the righthand side of the stripe conductor 110. Such a shift operation is possible by supplying the magnetic medium 21 with a pulsed magnetic field perpendicular to the magnetic medium 21, as described in conjunction with FIG. 5. Simultaneously, a current pulse is caused to flow through the stripe conductor 110 to induce, under the stripe conductor 110, a magnetic field which serves to cancel the inplane magnetic field $H_{ip}$ and, thereby, to stably keep the one negative Bloch line 105 on the righthand side of the stripe conductor 110.

Figure 10C:
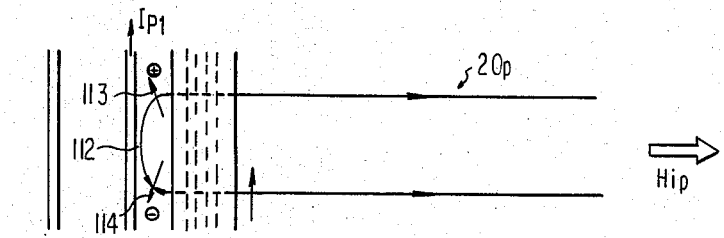

In FIG. 10(c), a first current pulse $I_{P1}$ is caused to flow through the first write-in line 56, as is the case with FIG. 4(b). As a result, magnetization 112 in the fist stripe head is locally twisted or rotated through 180° relative to the remaining wall magnetization to cause a first pair of positive and ngative Bloch lines 113 and 114 (depicted at plus and minus signs) to occur between the local magnetization and the remaining wall magnetization, when no magnetic bubble is present at a predetermined position in the vicinity of the first stripe head. This operation is similar to that described with reference to FIG. 4(b).

Figure 10D:
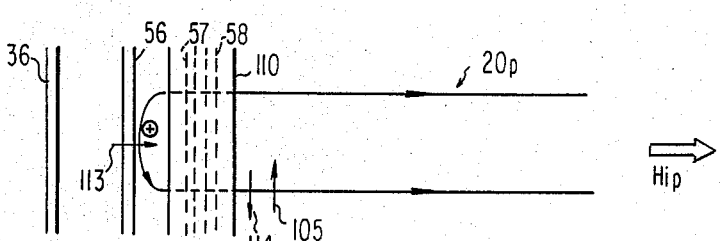

In FIG. 10(d), the positive and the negative Bloch lines 113 and 114 are placed at the first stripe head and on the righthand side of the stripe conductor 110 in the manner described in conjunction with FIG. 4(c), respectively.

Figure 4E:
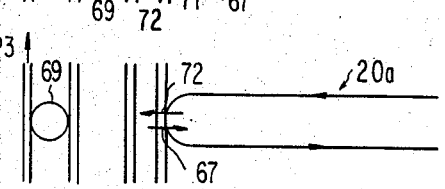
Figure 10E:
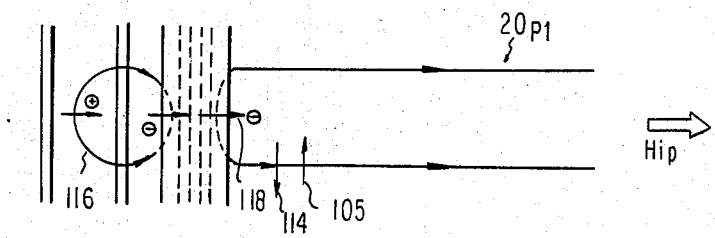

In FIG. 10(e), the particular stripe domain $20_P$ is chopped into an insignificant magnetic bubble 116 and the remaining stripe domain $20_{P1}$ by supplying the second and the third write-in lines 57 and 58 with second current pulses in a manner similar to that illustrated with reference to FIG. 4(e). In this event, a negative Bloch line 118 is left in the remaining stripe domain $20_{P1}$ by the influence of the inplane magnetic field $H_{ip}$. The insignificant magnetic bubble 116 is transferred along the first major line 36 in the manner mentioned with reference to FIG. 4(e) and is finally erased in a known manner.

Figure 11:
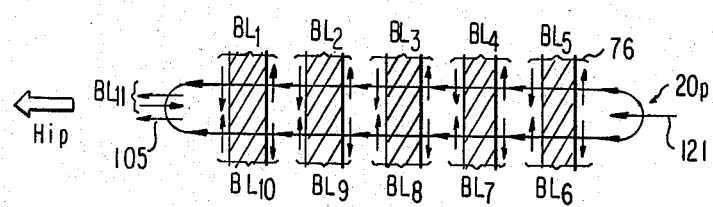
FIG. 11 shows a plan view for use in describing transfer operation of the magnetic memory device according to the second embodiment.

Referring to FIG. 11, first through eleventh bits of the information signals are written in the particular stripe domain $20_P$ in the form of first through eleventh Bloch line pairs $BL_1$ to $BL_{11}$, like in FIG. 5. It is noted here that each pair is disposed on both sides of each pattern of Permalloy and that the disposition is diffferent from that illustrated in FIG. 5. In addition, the nominal negative Bloch lines depicted at 105 and 121 are kept at the first and the second stripe heads when the particular stripe domain $20_P$ is full of the Bloch line pairs. An inplane magnetic field $H_{ip}$ is directed leftwards of FIG. 11 to stably hold each Bloch line in the particular stripe domain $20_P$.

Referring to FIGS. 12(a)–12(d) together with FIG. 2, the magnetic memory device according to the second embodiment of this invention comprises a second conductor portion 42 comprising first and second readout lines 81 and 82, as is the case with FIG. 6. The illustrated second conductor portion 42 further comprises a stripe conductor 123 overlaid on the first and the second readout lines 81 and 82 with an insulator layer interposed between the stripe conductor 123 and the first and the second readout lines 81 and 82. The stripe conductor 123 is extended parallel to the second major line 37 as well as the first and the second readout lines 81 and 82. An inplane magnetic field $H_{ip}$ is directed rightwards of FIGS. 12(a)–12(d) during readout operation, as shown on the righthand side of this figure.

Let the particular stripe domain $20_P$ be illustrated in FIGS. 12(a)–12(d), like in FIGS. 10(a)–10(e) and a single negative Bloch line 125 be followed by a pair of negative Bloch lines 127. Each Bloch line is assumed to be successively moved counterclockwise by a pulsed bias magnetic field perpendicular to the principal surface of the magnetic medium 21.

Figure 12A:
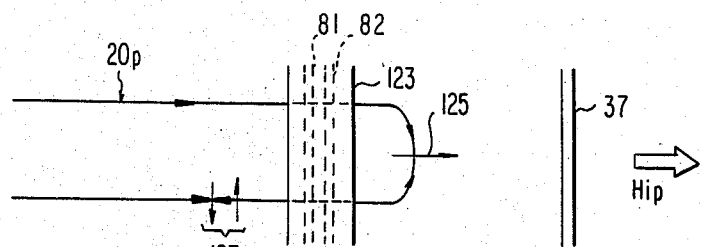
FIGS. 12(a)–12(d) show plan views for use in describing readout operation of the magnetic memory device according to the second embodiment.

In FIG. 12(a), the single negative Bloch line 125 is placed at the second stripe head while the following negative Bloch line pair 127 is positioned on the lefthand side of the stripe conductor 123.

Figure 12B:
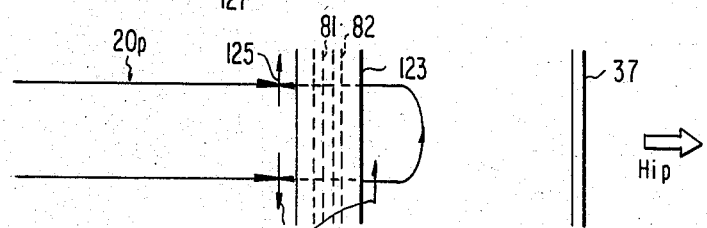

In FIG. 12(b), a current pulse is caused to flow from the readout current source 84 (FIG. 2) through the stripe conductor 123 to generate under the stripe conductor 123 a local magnetic field which is directed leftwards of FIGS. 12(a)–12(d) and which is stronger than the inplane magnetic field $H_{ip}$. The resultant single negative Bloch line is moved counterclockwise to be placed on the lefthand side of the stripe conductor 123 while the resultant lines of the pair 127 are placed on both sides of the stripe conductor 123. The righthand side one of the pair is stabilized at the second stripe head.

Figure 12C:
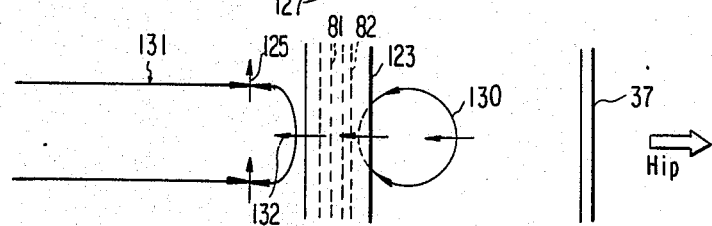

Under the circumstances, the first and the second readout lines 81 and 82 are supplied with current pulses in senses opposite to each other during supply of the current pulse to the stripe conductor 123. As a result, the particular stripe domain $20_P$ is chopped into a significant magnetic bubble 130 and the remaining stripe domain 131, as shown in FIG. 12(c). In this event, a negative Bloch line 132 is reproduced or replicated in the remaining stripe domain 131 by virtue of the local magnetic field induced by the stripe conductor 123 against the inplane magnetic field $H_{ip}$. On the other hand, the significant bubble 130 has a pair of negative Bloch lines corresponding to those left in the remaining stripe domain 131.

Figure 12D:
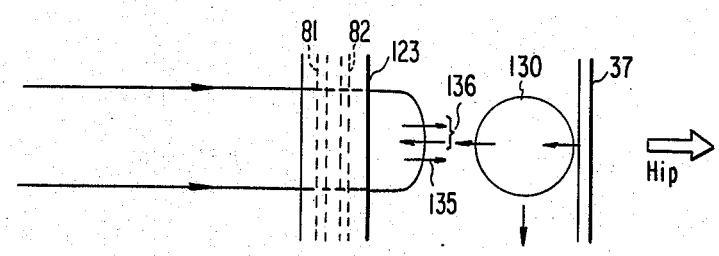

In FIG. 12(d), the significant magnetic bubble 130 is moved along the second major line 37 by supply of current pulses to the second readout conductor 82 and the second major line 37 in the manner described in conjunction with FIG. 6(d). Such supply of the current pulses is controlled so that a single Bloch line 135 which follows a pair of Bloch lines 136 at the second stripe head is shifted to the lefthand side of the stripe conductor 123.

The above-mentioned chopping operation is carried out by utilizing variation of a chopping property between parallel wall magnetization and nonparallel wall magnetization, as mentioned in connection with FIGS. 7(a), 7(b) and 8(a), 8(b).

Referring to FIGS. 13(a)–13(d), description will be made about erasing operation for erasing a preselected one of the Bloch line pairs that is indicated at 140 in FIGS. 13(a)–13(d). Let the preselected Bloch line pair 140 be memorized in the particular stripe domain $20_P$ illustrated in FIGS. 12(a)–12(d). In the example being illustrated, the erasing operation is carried out by the use of the first and the second readout lines 81 and 82. The preselected Bloch line pair 140 preceded by a single Bloch line 141 is shifted towards the second stripe head in the above-mentioned manner, as illustrated in FIG. 13(a), and is collected together with the single Bloch line 141 at the second stripe head, as shown in FIG. 13(b).

Under the circumstances, the particular stripe domain $20_P$ is chopped into a magnetic bubble 143 and the remaining stripe domain $20_{P1}$, as illustrated in FIG. 13(c). Such a chopping operation is possible by supplying the first and the second readout lines 81 and 82 with current pulses similar to those used in the readout operation described with reference to FIGS. 12(a)–12(d). This is because wall magnetization in the domain wall becomes parallel to each other between the first and the second readout lines 81 and 82 and such parallel magnetization is readily chopped off, as is the case with FIGS. 12(a)–12(d). In other words, a group of three Bloch lines collected at each stripe head is helpful to accomplish parallel wall magnetization.

Anyway, such chopping operation results in replication of sole Bloch line 145 indentical with the single Bloch line 141 preceding the preselected Bloch line pair 140. The replication of the identical Bloch line is due to the influence of the inplane magnetic field directed rightwards of FIG. 13.

As a result of the chopping operation, the preselected Bloch line pair 140 is held in the magnetic bubble 143 separated from the stripe domain $20_{P1}$ and is therefore erased from the stripe domain $20_{P1}$. The magnetic bubble 143 is thereafter transferred along the second major line 37 to be erased in a known manner, as readily understood from FIG. 13(d).

As mentioned before, each Bloch line pair is stabilized in a stripe domain of $S=0$ rather than in a stripe domain of $S=1$. The reasons will be described below.

Referring to FIGS. 14(a) and 14(b), first and second pairs 151 and 152 of Bloch lines are kept at an upper and a lower portion of a domain wall of a stripe domain 153 of $S=1$ in an initial state, as shown in FIG. 14(a). Let an inplane magnetic field be applied rightwards of FIG. 14(b) due to influences of geomagnetism, slight displacement of orthogonality between the principal surface of the magnetic medium 21 and the bias magnetic field which is to become orthogonal to the principal surface, and the like.

The inplane magnetic field acts to divide the first pair 151 into two Bloch lines and to move both of the divided lines towards stripe heads of the stripe domain 153. Eventually, the divided lines are disposed and stabilized at both heads, as illustrated in FIG. 14(b). This is because such disposition of the Bloch lines enables a reduction of Zeeman energy. Accordingly, there is a probability that either one of two pairs memorized is separated into two Bloch lines.

In addition, the separated Bloch lines may be returned back to both stripe heads due to the inplane magnetic field on extinction of a pulsed bias magnetic field after they are shifted counterclockwise by supply of the pulsed bias magnetic field.

The above-mentioned inconvenience is eliminated by the use of a stripe domain having a pair of negative Bloch lines in an initial state, as described with reference to FIGS. 10(a) through 13(d). Such a stripe domain may be called a stripe domain of S=0. The reasons will be described below.

Figure 15A:
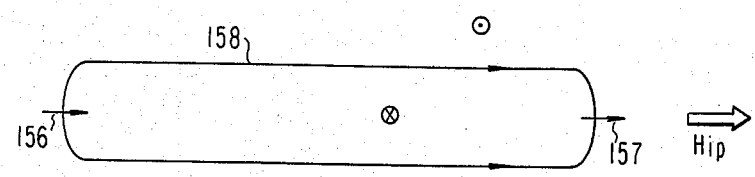
FIGS. 15(a)–15(e) show plan views for use in describing movement of Bloch lines carried out when use is made of a stripe domain of S=0.

Referring to FIGS. 15(a)–15(e), a pair of Bloch lines 156 and 157 is written in a stripe domain 158. The Bloch line pair 156 and 157 carries no information and may therefore be named a nominal Bloch line pair. The write-in operation of the nominal Bloch line pair 156 and 157 is carried out in the manner described before prior to write-in operation of true Bloch line pairs carrying information, as illustrated in FIG. 15(a). As a result, the number S of revolutions of the wall magnetization becomes equal to zero. The Bloch lines 156 and 157 are stabilized at both stripe heads of the stripe domain 158 in the presence of an inplane magnetic field $H_{ip}$ directed rightwards of FIGS. 15(a)–15(e).

Figure 15B:
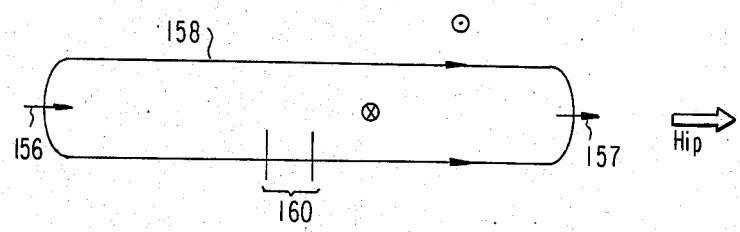

Let a single pair of the true Bloch lines 160 be written in the stripe domain 158 as shown in FIG. 15(b). Under the circumstances, the true Bloch line pair 160 is shifted counterclockwise by supply of the pulsed bias magnetic field to arrive at a stripe head of the stripe domain 158. Thus, three of the Bloch lines are placed at the stripe head as illustrated in FIG. 15(c).

Figure 15C:
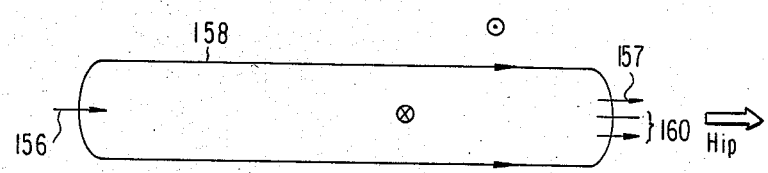
Figure 15D:
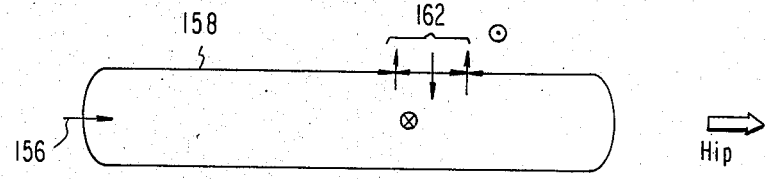
Figure 15E:
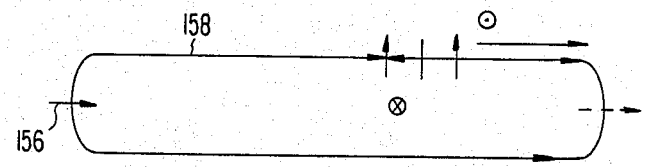

Further supply of the pulsed bias magnetic field gives rise to concurrent migration of a Bloch line trio collectively indicated at 162 in FIG. 15(c). However, the inplane magnetic field $H_{ip}$ makes the last line of the trio come back to the stripe head when the pulsed bias magnetic field is extinct, as shown in FIG. 15(e). This is because Zeeman energy is reduced in the whole of the stripe domain 158 by the disposition of the Bloch lines illustrated in FIG. 15(e). Thus, the Bloch line pair 160 is stably shifted.

This means that transmission of each Bloch line pair which is strong against perturbation is possible by intentionally providing the inplane magnetic field stronger than an external magnetic field along the stripe domain.

While this invention has thus far been described in conjunction with a few embodiments thereof, it will readily be possible for those skilled in the art to put this invention into practice in various manners. For example, each stripe domain is interposed between a pair of conductors which is helpful to define an area of each stripe domain and to transfer each vertical Bloch line pair. The write-in and the readout lines may be disposed at the same stripe head.

What is claimed is:

1. A magnetic memory device capable of magnetically memorizing a plurality of information signals to produce an output signal representative of each of said information signals, by the use of a magnetic medium having a principal surface and an easy axis of magnetization orthogonal to said principal surface, said magnetic memory device comprising:

controllably generating means for controllably generating at least one magnetic domain of a stripe shape that is surrounded by a domain wall laid in substantial parallel to said easy axis and having wall magnetization along said domain wall and that has a pair of end portions opposite to each other and an intermediate portion between said end portions;

write-in means adjacent to a predetermined one of said end portions and responsive to said each information signal for writing said each information signal in said domain wall in the form of a first pair of vertical Bloch lines intersecting said domain wall;

detecting means adjacent to a specific one of said end portions for detecting said first vertical Bloch line pair to produce said output signal; and transferring means for transferring said first vertical Bloch line pair from said predetermined end portion to said specific one of the end portions through said intermediate portion within said domain wall.

2. A magnetic memory device as claimed in claim 1, further comprising:

erasing means placed in the vicinity of a prescribed one of said end portions for erasing said vertical Bloch line pair.

3. A magnetic memory device as claimed in claim 1, wherein said magnetic domain previously keeps a pair of vertical Bloch lines prior to storage of said information signals.

4. A magnetic memory device as claimed in claim 1, said stripe-shaped magnetic domain being retractable and expandable relative to a predetermined position which is nearer to said predetermined end portion than the other of said end portions, wherein said write-in means comprises:

means reponsive to said each information signal for selectively disposing a magnetic bubble in the vicinity of said predetermined position to retract said predetermined end portion from said predetermined position only when said magnetic bubble is in the vicinity of said predetermined position; and Bloch line writing means for writing said first vertical Bloch line pair in said predetermined end portion only when a magnetic bubble is not disposed in the vicinity of said predetermined position.

5. A magnetic memory device as claimed in claim 4, wherein said Bloch line writing means comprises:

signal producing means for producing a first signal and a second signal following said first signal;

first conductor means adjacent to said predetermined position and connected to said signal producing means for allowing said first signal to pass therethrough and, thereby, to write first and second vertical Bloch lines in said predetermined end portion only when no magnetic bubble is present in the vicinity of said predetermined position;

second conductor means laid in parallel to said first conductor means and connected to said signal producing means for chopping said predetermined end portion into an insignificant magnetic bubble and the remaining stripe domain so as to leave a third vertical Bloch line in the remaining stripe domain together with said second vertical Bloch line and to leave said first Bloch line in said insignificant magnetic bubble when said second signal is supplied from said signal producing means to said second conductor means with said first and said second Bloch lines placed on both sides of said second conductor means; and means for rendering said second and said third vertical Bloch lines into said first vertical Bloch line pair.

6. A magnetic memory device as claimed in claim 5, each of said first through said third vertical Bloch lines being specified by a negative and a positive sign, wherein said first vertical Bloch line is represented by said positive sign while said second and said third vertical Bloch lines, said negative sign.

7. A magnetic memory device as claimed in claim 6, wherein said detecting means comprises:

means for producing a third signal;

a pair of conductors laid in the vicinity of said specific end portion in parallel to each other with a gap left therebetween for allowing said third signal to pass therethrough opposite to each other to selectively chop said specific end portion into a significant magnetic bubble and a chopped stripe domain only when said first vertical Bloch line pair is present at said specific end portion; and means for deriving said output signal from presence and absence of said significant magnetic bubble.

8. A magnetic memory device as claimed in claim 7, wherein said transferring means comprises:

magnetic field means for successively producing a pulsed magnetic field orthogonal to said principal surface to transfer said first vertical Bloch line pair from said predetermined end poriton to said specific end portion.

* * * * *